(12) United States Patent
Ngo et al.

(10) Patent No.: US 6,858,503 B1
(45) Date of Patent: Feb. 22, 2005

(54) DEPLETION TO AVOID CROSS CONTAMINATION

(75) Inventors: Minh V. Ngo, Fremont, CA (US); Ming-Ren Lin, Cupertino, CA (US); Paul R. Besser, Sunnyvale, CA (US); Qi Xiang, San Jose, CA (US); Eric N. Paton, Morgan Hill, CA (US); Jung-Suk Goo, Stanford, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 4 days.

(21) Appl. No.: 10/358,484

(22) Filed: Feb. 5, 2003

(51) Int. Cl.[7] .............................................. H01L 21/336
(52) U.S. Cl. ...................................... 438/285; 438/509
(58) Field of Search ................................. 438/285, 509, 438/FOR 407; 257/E29.297, E29.298

(56) References Cited

U.S. PATENT DOCUMENTS

| | | | | |
|---|---|---|---|---|
| 4,863,561 A | * | 9/1989 | Freeman et al. ............. 134/1.2 |
| 5,342,805 A | * | 8/1994 | Chan et al. ................... 117/89 |
| 5,403,434 A | * | 4/1995 | Moslehi ....................... 134/1.2 |
| 5,578,133 A | * | 11/1996 | Sugino et al. ................. 134/2 |
| 5,891,769 A | * | 4/1999 | Liaw et al. ................. 438/167 |
| 6,235,568 B1 | * | 5/2001 | Murthy et al. .............. 438/231 |
| 6,316,357 B1 | * | 11/2001 | Lin et al. .................... 438/662 |
| 2003/0068883 A1 | * | 4/2003 | Ajmera et al. ............. 438/664 |
| 2004/0005740 A1 | * | 1/2004 | Lochtefeld et al. ......... 438/149 |
| 2004/0067644 A1 | * | 4/2004 | Malik et al. ................ 438/689 |

OTHER PUBLICATIONS

Ghandhi S. "VLSI Fabrication Principles: Silicon and Gallium Arsenide", 2nd Edition, 1994, John Wiley & Sons, Inc., p. 641.*

* cited by examiner

Primary Examiner—George Fourson
(74) Attorney, Agent, or Firm—Foley & Lardner LLP

(57) ABSTRACT

A fabrication system utilizes a protocol for removing germanium from a top surface of a wafer. An exposure to a gas, such as a gas containing the hydrochloric acid can remove germanium from the top surface. The protocol can allow shared equipment to be used in both Flash product fabrication lines and strained silicon (SMOS) fabrication lines. The protocol allows better silicidation in SMOS devices.

21 Claims, 4 Drawing Sheets

DEPLETION TO AVOID CROSS CONTAMINATION

FIELD OF THE INVENTION

The present invention relates generally to integrated circuit (IC) fabrication. More particularly, the present invention relates to a system for and a method of depleting a top surface of an IC substrate.

BACKGROUND OF THE INVENTION

SMOS processes are utilized to increase transistor (MOSFET) performance by increasing the carrier mobility of silicon, thereby reducing resistance and power consumption and increasing drive current, frequency response and operating speed. Strained silicon is typically formed by growing a layer of silicon on a silicon germanium substrate or layer. Germanium can also be implanted, deposited, or otherwise provided to silicon layers to change the lattice structure of the silicon and increase carrier mobility.

The silicon germanium lattice associated with the germanium substrate is generally more widely spaced than a pure silicon lattice, with spacing becoming wider with a higher percentage of germanium. Because the silicon lattice aligns with the larger silicon germanium lattice, a tensile strain is created in the silicon layer. The silicon atoms are essentially pulled apart from one another. Relaxed silicon has a conductive band that contains six equal valance bands. The application of tensile strength to the silicon causes four of the valance bands to increase in energy and two of the valance bands to decrease in energy. As a result of quantum effects, electrons effectively weigh 30 percent less when passing through the lower energy bands. Thus, lower energy bands offer less resistance to electron flow.

In addition, electrons meet with less vibrational energy from the nucleus of the silicon atom, which causes them to scatter at a rate of 500 to 1,000 times less than in relaxed silicon. As a result, carrier mobility is dramatically increased in strained silicon compared to relaxed silicon, providing an increase in mobility of 80 percent or more for electrons and 20 percent or more for holes. The increase in mobility has been found to persist for current fields up to 1.5 megavolt/centimeter. These factors are believed to enable device speed increase of 35 percent without further reduction of device size, or a 25 percent reduction in power consumption without reduction in performance.

The use of germanium in SMOS processes can cause germanium contamination problems for IC structures, layers and equipment. In particular, germanium outgassing or outdiffusion can contaminate various components associated with the fabrication equipment and integrated circuit structures associated with the processed wafer. Germanium outgassing can be particularly problematic at the very high temperatures and ambient environments associated with integrated circuit fabrication. For example, conventional IC fabrication processes can utilize temperatures of approximately 1000° C., which enhance germanium outgassing. Germanium outgassing can also negatively affect the formation of thin films. In addition, germanium outdiffusion can cause germanium accumulation or "pile up" at the interface of layers.

High levels of germanium at the surface of a wafer can adversely affect the formation of silicide layers. In particular, high concentration of germanium in a top surface of a substrate can adversely affect the formation of silicide layers above the source and drain regions. The germanium concentration at the top surface can be exacerbated by the fabrication steps associated with source and drain regions and gate structures.

Germanium contamination of IC equipment is becoming a more serious issue as IC fabrication processes explore the advantages of the higher carrier mobility of strained silicon (SMOS) devices. IC fabrication equipment that tends to become contaminated with germanium can include deposition chambers, furnaces, diffusion equipment, etching tools, etc. The quartzware associated with such equipment is particularly susceptible to germanium contamination.

Germanium contamination is particularly problematic when equipment is used in both non-germanium and germanium fabrication lines. Shared equipment must be purged of germanium contamination before it is used in non-germanium processes, because such contamination is particularly damaging to metals used during conventional IC fabrication. Further, high levels of germanium contamination can be problematic even for strained silicon (SMOS) processes.

Flash devices are particularly sensitive to low level germanium contamination, because Flash technology uses IC structures and processes that are incompatible with germanium. For example, germanium contamination may cause data retention problems for the Flash memory cell. It is nevertheless desirous to use equipment associated with the Flash fabrication line with germanium containing products (e.g., SMOS products).

Thus, there is a need for an efficient process for decontaminating a wafer surface. Further, there is a need for a system and a method which reduces germanium contamination. Even further, there is a need for a method of removing germanium from a strained silicon layer. Yet further, there is a need for a process which reduces the adverse effects of germanium on silicidation processes. Further, there is a need for a decontamination process that allows shared equipment to be used in both a Flash production line and a germanium production line.

SUMMARY OF THE INVENTION

An exemplary embodiment relates to a method of manufacturing an integrated circuit in an SMOS process. The method includes providing a substrate which includes a layer including germanium and a strained silicon layer. The method also includes providing a gate structure above the strained silicon layer and providing a hydrochloric acid ambient. The method also includes annealing the substrate to deplete a top surface of the strained silicon layer of the germanium.

Another exemplary embodiment relates to a method of depleting germanium from a top surface of an IC substrate in a chamber. The method includes providing a hydrochloric acid ambient in the chamber and annealing the IC substrate in the chamber to cause the hydrochloric acid to react with the germanium.

Yet another exemplary embodiment relates to a method of manufacturing a transistor on an integrated circuit in an SMOS process. The method includes providing a gate structure on a top surface of a strained silicon layer above a silicon germanium layer, providing a gas including HCl and annealing at a temperature. In one embodiment the temperature is approximately 700° C.

BRIEF DESCRIPTION OF THE DRAWINGS

Exemplary embodiments will hereafter be described with reference to the accompanying drawings, wherein like numerals denote like elements, and.

DETAILED DESCRIPTION OF PREFERRED EXEMPLARY EMBODIMENTS

FIGS. 1 through 9 illustrate a method of manufacturing an integrated circuit (IC) in accordance with an exemplary embodiment. The method illustrated in FIGS. 1 through 9 reduces germanium outgassing and outdiffusion problems associated with silicon germanium layers on IC structures. The process includes at least one germanium depletion step and can be used as a part of any process utilizing germanium or other substance prone to outgassing at high temperatures. Advantageously, germanium is depleted from a top surface of the IC substrate or layers above the IC substrate.

Figure 1:
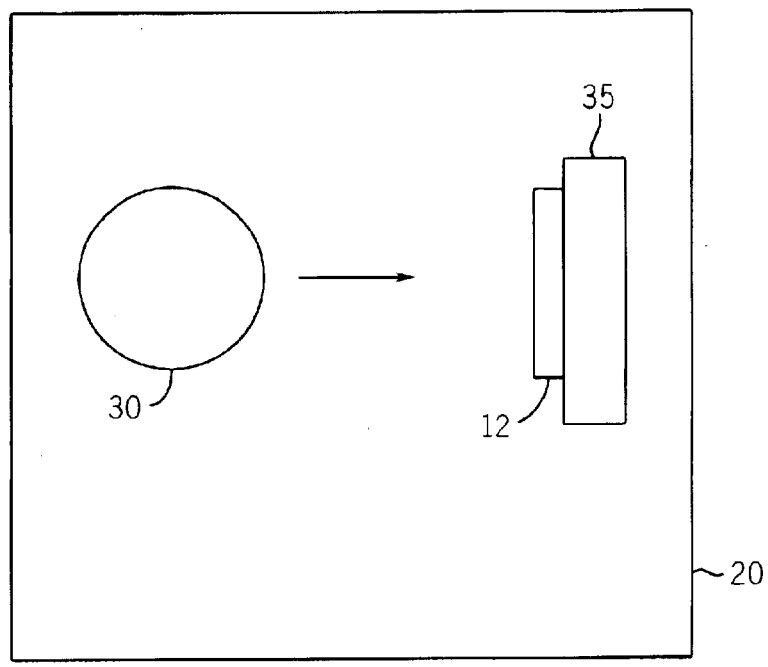
FIG. 1 is a general schematic block diagram of a fabrication system including a chamber and an IC substrate.

With reference to FIG. 1, fabrication system or equipment 20 is preferably a fabrication tool or fabrication equipment associated with a germanium fabrication process, such as, an SMOS process. In one embodiment, system 20 can be etching equipment including a dry etching source 30. In another embodiment, fabrication system 20 can be a deposition chamber, a diffusion chamber, an annealing furnace, or another device for processing a substrate associated with a portion 12 of an integrated circuit. Quartzware associated with system 20 is particularly susceptible to germanium contamination.

System 20 can include a chamber within which portion 12 is provided. The chamber can generally include a stage 35 or a pedestal for holding portion 12.

In one embodiment, system 20 can be utilized in a fabrication line associated with both a germanium process and a non-germanium process. During operation in the germanium process, system 20 can become contaminated with germanium and should be decontaminated before use in the non-germanium process.

Figure 2:
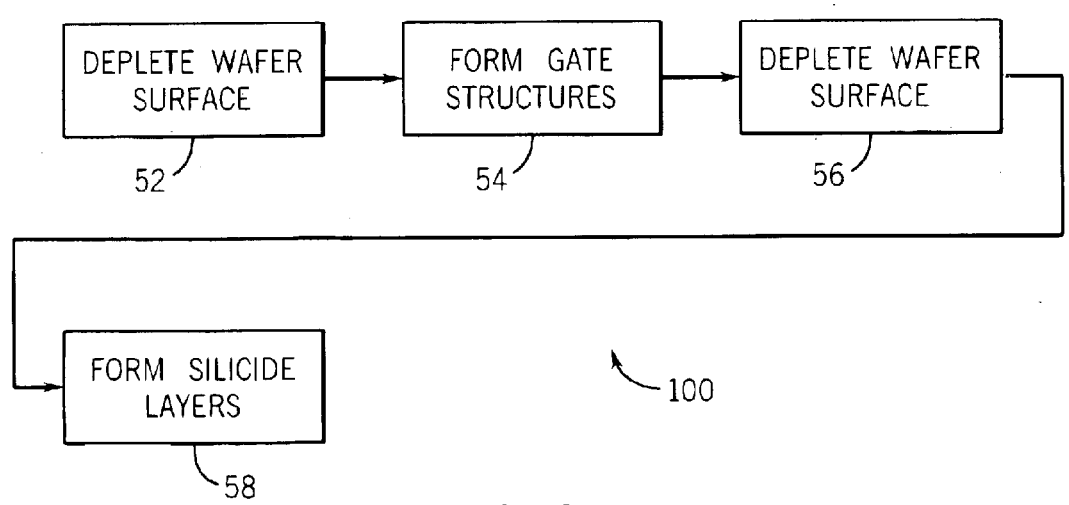
FIG. 2 is a flow diagram showing a depletion process for the fabrication system illustrated in FIG. 1 in accordance with an exemplary embodiment.
Figure 3:
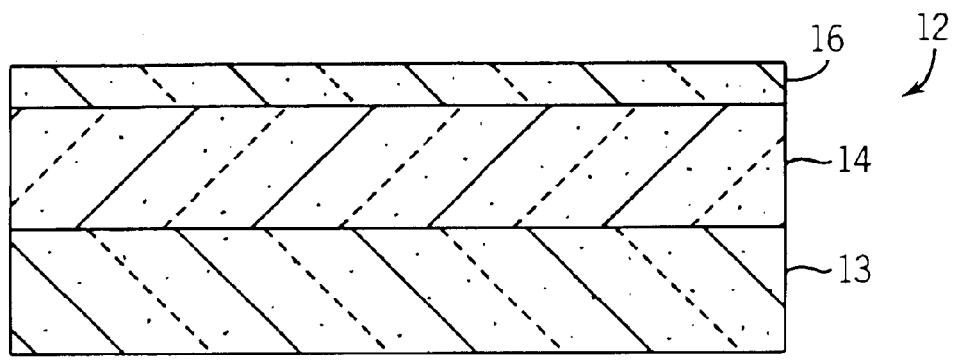
FIG. 3 is a cross-sectional view schematic drawing of a portion of an IC substrate illustrated in FIG. 1, the IC substrate including a strained silicon layer above a silicon germanium substrate.
Figure 4:
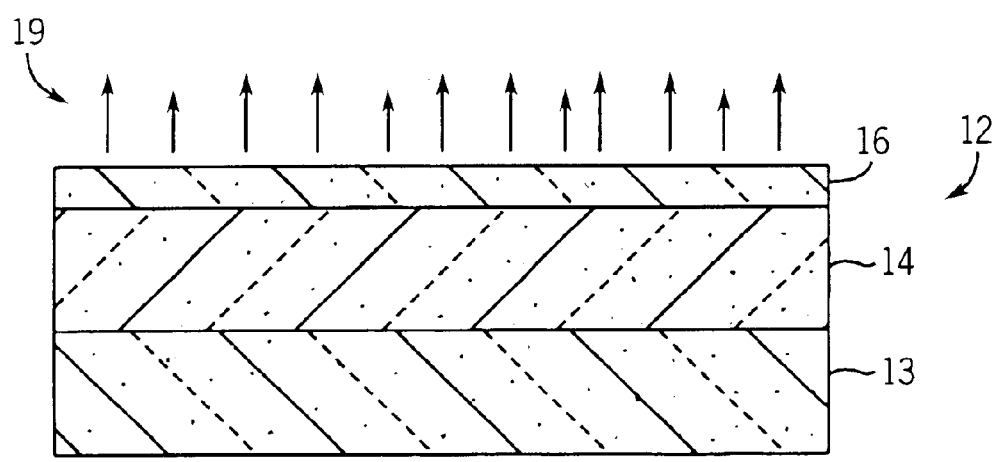
FIG. 4 is a cross-sectional view of the portion illustrated in FIG. 3, showing a depletion step.

With reference to FIG. 2, a process 100 can be utilized to deplete portion 12 (e.g., the substrate associated with portion 12) of germanium. Preferably, process 100 depletes germanium from a top surface of the substrate associated with portion 12 of germanium in a step 52.

After the surface is depleted in step 52, process 100 forms gate structures above the top surface of the substrate associated with portion 12 in a step 54. In a step 56, the surface of the substrate associated with portion 12 is depleted to remove germanium. In a step 58, silicide layers can be formed. The silicide layers are preferably formed above source and drain regions on either side of the gate structures formed in step 54. Depletion of germanium at steps 52 and 56 allows suitable suicide layers to be formed.

Steps 52 and 56 of process 100 can be performed to convert germanium on or near the top surface of the substrate for portion 12 to germanium oxide or germanium chloride. Germanium oxide and germanium chloride are volatile molecules which can be more easily removed from the chamber. Removing germanium from the substrate by process 100 can reduce germanium contamination associated with SMOS processes.

In one embodiment, process 100 utilizes depletion step 52 before gate formation and depletion step 56 after gate formation. Alternatively, only one of steps 52 or 56 can be performed without departing from the scope of the invention.

At a step 52, the chamber associated with system 20 is provided with a gaseous media. In one embodiment, a hydrochloric acid (HCl) ambient is provided in the chamber and portion 12 is subjected to a furnace anneal at a temperature of 700° C. (e.g., in a range of 650° C. to 750° C.). Preferably, the HCl atmosphere getters the germanium from the top surface to form a gas of germanium chloride which can be evacuated from the chamber. Preferably, the chamber is a vacuum chamber. In one embodiment, HCl is provided at a temperature of approximately 700° C. and a pressure of 100 millitorr.

In another alternative, a laser technology anneal rather than a furnace anneal is utilized. The laser technology anneal is preferably performed at a temperature of 700° C. at 0.19 joules/cm$^2$ of radiant fluence for between approximately 10 and 100 nanoseconds.

In yet another embodiment, a mixture of hydrochloric acid (HCl) gas and oxygen ($O_2$) gas is provided to the chamber of system 20 in step 52. Step 56 can utilize the same parameters as step 52. In one embodiment, an HCl gas is used in one of steps 52 and 56 and an HCl and $O_2$ gas is used in the other of steps 52 and 56.

Referring to FIGS. 3 through 9, a cross-sectional view of a portion 12 of an integrated circuit (IC) is illustrated. Portion 12 is subjected to process 100 (FIG. 2) to form an IC. The IC can include a transistor with a gate structure and silicided source and drain region as explained below. Portion 12 includes a strained silicon layer 16 provided over a semiconductor substrate 14 or a germanium containing layer or substrate. Substrate 14 can be provided above a substrate 13.

Substrate 13 is optional and portion 12 can be provided with substrate 14 as the bottom-most layer. Substrate 13 can be the same material or a different material than substrate 14. In one embodiment, substrate 13 is a semiconductor substrate such as a silicon substrate upon which substrate 14 has been grown.

Portion 12 can be any type of semiconductor device, or portion thereof, made from any of the various semiconductor processes such as a complementary metal oxide semiconductor (CMOS) process, a bipolar process, or any other semiconductor process. Portion 12 may be an entire IC or a portion of an IC and may include a multitude of electronic components.

Substrate 14 is preferably a silicon germanium or other semiconductor material including germanium, and can be doped with P-type dopants or N-type dopants. Substrate 14 can be an epitaxial layer provided on a semiconductor or an insulative base, such as substrate 13. Furthermore, substrate 14 is preferably a composition of silicon germanium ($Si_{1-x}Ge_x$, where X is approximately 0.2 and is more generally in the range of 0.1–0.4). Substrate 14 can be grown or deposited.

In one embodiment, substrate 14 is grown above substrate 13 by chemical vapor deposition (CVD) using disilane ($Si_2H_6$) and germane ($GeH_4$) as source gases with a substrate temperature of approximately 650° C., a disilane partial pressure of approximately 30 mPa and a germane partial pressure of approximately 60 mPa. Growth of silicon germanium material may be initiated using these ratios, or, alternatively, the partial pressure of germanium may be gradually increased beginning from a lower pressure or zero pressure to form a gradient composition. Alternatively, a silicon layer can be doped by ion implantation with germanium or by another process to form substrate 14. Preferably, substrate 14 is grown by epitaxy to a thickness of less than approximately 5000 Angstroms (and preferably between approximately 1500 and 4000 Angstroms).

A strained silicon layer 16 is formed above substrate 14 by an epitaxial process. Preferably, layer 16 is grown by CVD at a temperature of approximately 600° C. Layer 16 can be a pure silicon layer and have a thickness of approximately 500 Angstroms. According to alternative embodiments, layer 16 has a thickness of between approximately 50 and 150 Angstroms.

With reference to FIGS. 1–9, process 100 is described with respect to portion 12. At step 52, portion 12 is depleted and the removal of germanium from a top surface of layer 16 is represented by arrows 19. Preferably, arrows 19 represent the changing of germanium to a gas state which is evacuated from the chamber in FIG. 4.

Figure 5:
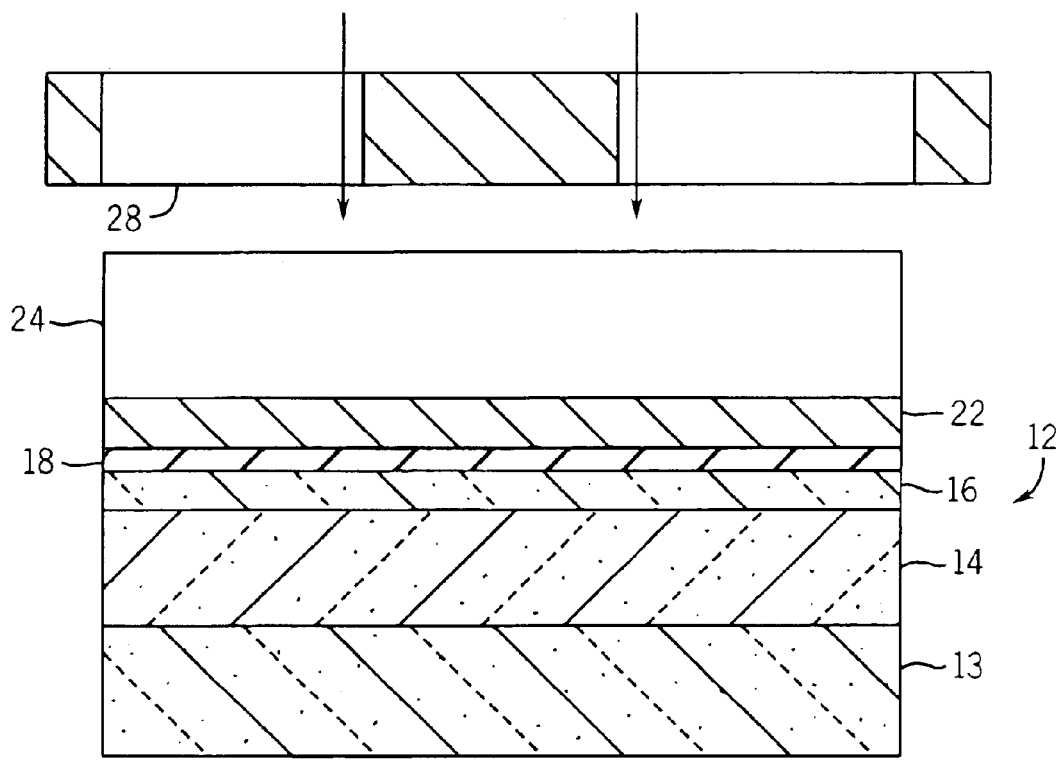
FIG. 5 is a cross-sectional view of the portion illustrated in FIG. 4, showing a lithographic exposure step for a photoresist layer above a gate conductor layer and a gate dielectric layer.
Figure 6:
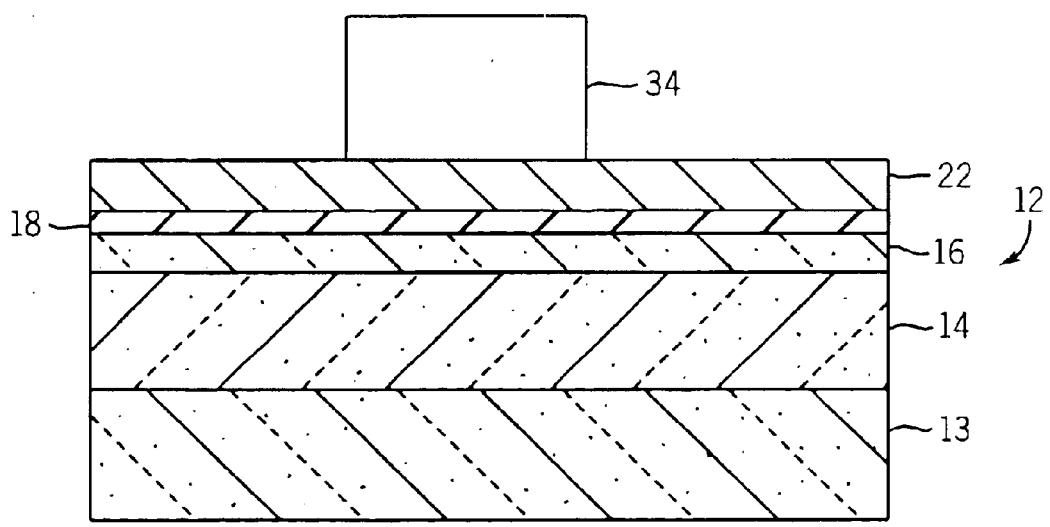
FIG. 6 is a cross-sectional view of the portion illustrated in FIG. 5, showing a selective patterning step for the photoresist layer.
Figure 7:
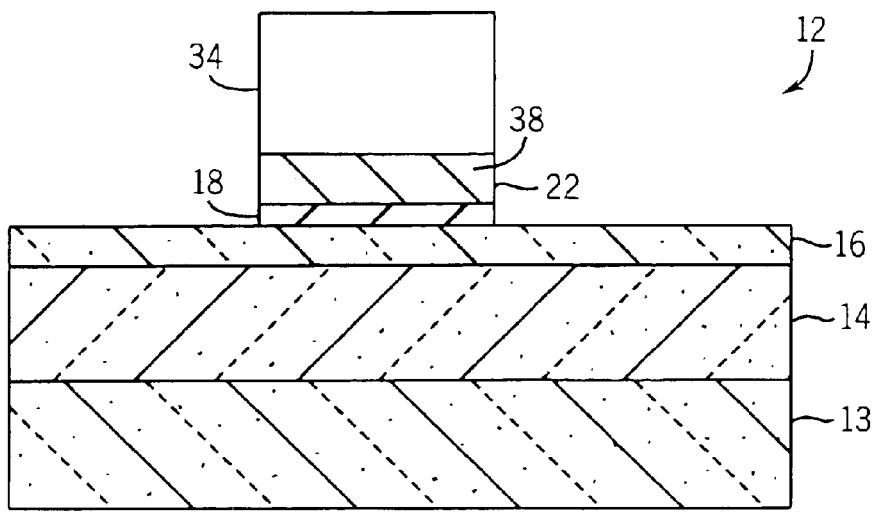
FIG. 7 is a cross-sectional view of the portion illustrated in FIG. 6, showing a selective etching step for the gate conductor layer and the gate dielectric layer.

In FIGS. 5–7, portion 12 is subjected to a gate formation process to form gate structures in accordance with step 54. A gate dielectric layer 18 is provided below a gate conductor layer 22. Preferably, gate dielectric layer 18 is a silicon dioxide layer, such as a 5–20 Angstrom thermally grown silicon dioxide layer, and layer 22 is a polysilicon layer, which may be either doped or undoped. Alternative materials for layers 18 and 22 are possible including any of a variety of known semiconductor, metal, high-k gate dielectric, and other IC materials.

A photoresist layer 24 provided above layer 22 is lithographically patterned in accordance with a mask 28. In FIG. 6, photoresist layer 24 is selectively etched to leave a feature 34 representative of a gate structure. In FIG. 7, layers 18 and 22 are etched to leave a gate structure 38 associated with feature 34. Any removal process can be utilized to form gate structure 38.

Figure 8:
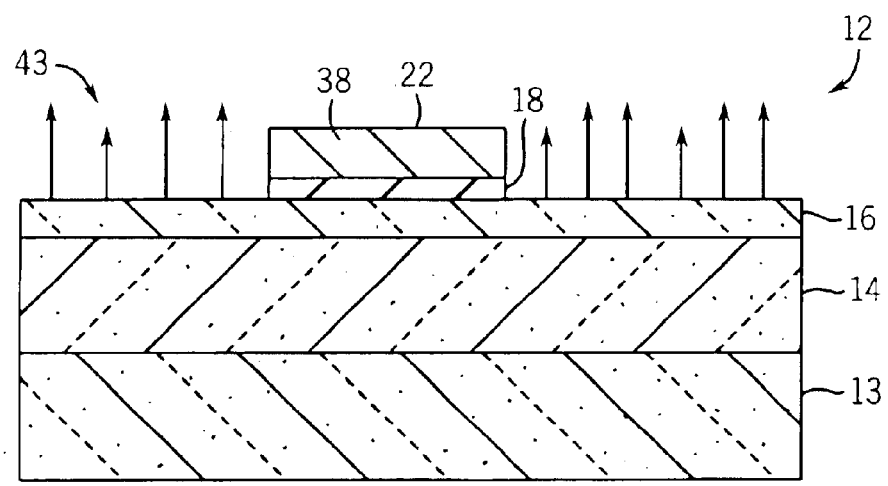
FIG. 8 is a cross-sectional view of the portion illustrated in FIG. 7, showing another depletion step.

In FIG. 8, portion 12 is subjected to a second depletion step 56. Depletion step 56 is performed after gate structure 38 is formed. In this way, germanium which has traveled to the top surface of layer 16 can be depleted. Germanium can travel to the top surface of layer 16 during fabrication steps associated with gate structure 38. For example, activation steps associated with source and drain region and gate structure 38 can cause germanium to diffuse to the top surface of portion 12. Preferably, layer 16 is depleted to a level approximately 100 to 400 Angstroms below a top surface of layer 16 in steps 52 and 56.

Figure 9:
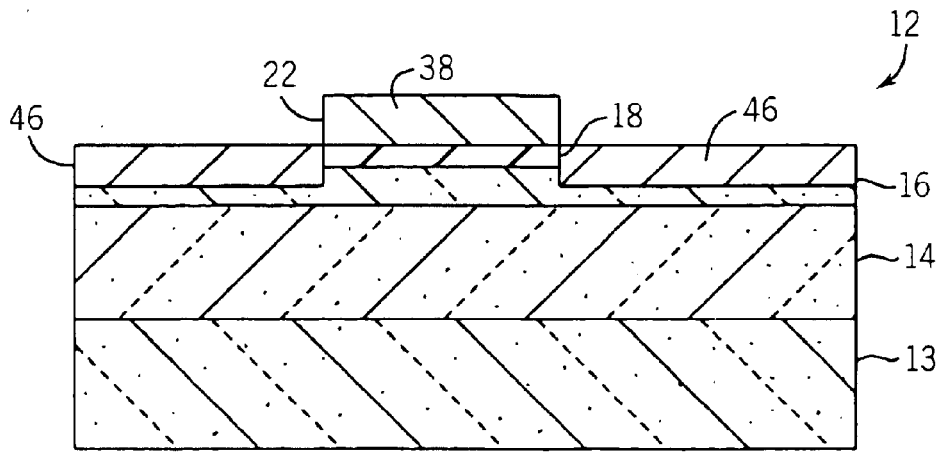
FIG. 9 is a cross-sectional view of the portion illustrated in FIG. 8, showing a silicidation step.

In FIG. 9, a silicide layer 46 is provided above layer 16. Silicide layer 46 may be tungsten silicide, cobalt silicide, nickel silicide, titanium silicide, or any of a variety of other silicide materials. According to an exemplary embodiment, silicide layer 46 is provided by depositing a layer of metal (e.g., a refractory metal) and heating at an elevated temperature (e.g., between approximately 550 and 650° C.) to form a silicide material. Other silicidation methods may be used in alternative embodiments.

Referring to FIG. 1, a substrate associated with a portion 12 of an integrated circuit is shown in a fabrication system 20 that is preferably used in both a Flash production line and in an SMOS production line. System 20 can be exposed to germanium during SMOS processes associated with the SMOS production line. The exposure to germanium can be due to germanium outgassing, germanium deposition, germanium implantation, or other germanium-based processes or techniques.

The substrate can be a semiconductor substrate such as silicon, gallium arsenide, germanium, or other substrate material. The substrate can include one or more layers of material and/or features such as lines, interconnects, vias, doped portions, etc., and can further include devices such as transistors, microactuators, microsensors, capacitors, resistors, diodes, etc. The substrate can be an entire IC wafer or part of an IC wafer. The substrate can be part of an integrated circuit such as a memory, a processing unit, an input/output device, etc.

Steps 52 and 56 can be performed a number of times or cycled to ensure depletion of germanium. In one embodiment, the temperature associated with the annealing can be cycled from a low temperature to a high temperature to ensure depletion of portion 12 and the conversion of germanium to germanium chloride or germanium oxide.

It is understood that although the detailed drawings, specific examples, and particular values given provide exemplary embodiments of the present invention, the exemplary embodiments are for the purpose of illustration only. The method and apparatus in the aforementioned embodiments are not limited to the precise details and descriptions disclosed. For example, although particular IC structures are described, other types of structures can also be depleted. Various changes may be made to the details disclosed without departing from the scope of the invention which is defined by the following claims.

What is claimed is:

1. A method of manufacturing an integrated circuit in an SMOS process, the method comprising:
   providing a substrate, the substrate including a layer including germanium and a strained silicon layer;
   providing a gate structure above the strained silicon layer;
   providing a hydrochloric acid ambient; and
   annealing the substrate in the hydrochloric acid ambient at a temperature of between 650° C. and 750° C. to deplete germanium from a top surface of the strained silicon layer.

2. The method of claim 1, wherein the steps of providing a hydrochloric acid ambient and annealing are performed before the gate structure is provided.

3. A method of manufacturing an integrated circuit in an SMOS process, the method comprising:
   providing a substrate, the substrate including a layer including germanium and a strained silicon layer;
   providing a gate structure above the strained silicon layer;
   providing a hydrochloric acid ambient; and
   annealing the substrate to deplete germanium from a top surface of the strained silicon layer;
   wherein the steps of providing a hydrochloric acid ambient and annealing are performed after a source and drain are implanted into the strained silicon layer.

4. The method of claim 3, further comprising providing a layer of silicide material above the strained silicon layer after the steps of providing a hydrochloric acid ambient and annealing are performed.

5. The method of claim 1, wherein the strained silicon layer is approximately 500 Angstroms thick.

6. The method of claim 1, further comprising providing a silicide layer after the annealing step.

7. A method of depleting germanium from a top surface of an IC substrate in a chamber, the method comprising:
   providing a hydrochloric acid ambient in the chamber; and
   annealing the IC substrate in the chamber at a temperature between 650° C. and 750° C. to cause the hydrochloric acid to react with the germanium.

8. A method of depleting germanium from a top surface of an IC substrate in a chamber, the method comprising:
   providing a hydrochloric acid ambient in the chamber; and
   annealing the IC substrate in the chamber to cause the hydrochloric acid to react with the germanium;
   wherein the providing and annealing steps are performed after a gate structure is formed on the IC substrate.

9. The method of claim 7, wherein the providing and annealing steps are performed before a gate structure is formed on the IC substrate.

10. The method of claim 8, wherein the providing and annealing steps are performed a second time after the gate is formed on the IC substrate.

11. The method of claim 10, wherein the IC substrate includes a silicon-germanium layer and a strained silicon layer at the top surface.

12. A method of depleting germanium from a top surface of an IC substrate in a chamber, the method comprising:
   providing a hydrochloric acid ambient in the chamber;
   annealing the IC substrate in the chamber to cause the hydrochloric acid to react with the germanium; and
   providing a silicide layer after the annealing step.

13. The method of claim 7, further comprising evacuating the chamber.

14. The method of claim 7, wherein the chamber includes a vacuum.

15. The method of claim 7, wherein the germanium reacts to form germanium chloride.

16. The method of claim 7, wherein the chamber is part of an etching device, and further comprising etching a dielectric material and a conductive material to form a gate structure.

17. A method of manufacturing a transistor on an integrated circuit in an SMOS process, the method comprising:
   providing a gate structure on a top surface of a strained silicon layer above a silicon germanium layer;
   providing a gas including HCl; and
   annealing in the gas including HCl at a temperature to remove germanium from the top surface.

18. The method of claim 17, wherein the temperature is approximately 700° C.

19. The method of claim 18, wherein the annealing is a laser annealing step.

20. The method of claim 19, wherein the method is utilized in a Flash device production process.

21. The method of claim 17, wherein the step of annealing at a temperature to remove germanium from the top surface is performed at a temperature of between 650° C. and 750° C.

* * * * *